(12) United States Patent
Lien et al.

(10) Patent No.: US 6,505,271 B1
(45) Date of Patent: Jan. 7, 2003

(54) INCREASING PRIORITY ENCODER SPEED USING THE MOST SIGNIFICANT BIT OF A PRIORITY ADDRESS

(75) Inventors: Chuen-Der Lien, Los Altos Hills, CA (US); Chau-Chin Wu, Cupertino, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/439,968

(22) Filed: Nov. 12, 1999

(51) Int. Cl.[7] ............................................. G06F 12/06
(52) U.S. Cl. ..................... 711/108; 711/158; 711/167; 711/217; 711/220; 365/49; 365/50
(58) Field of Search ................................. 711/108, 151, 711/158, 167, 217, 220; 365/49, 50

(56) References Cited

U.S. PATENT DOCUMENTS

| | | | |
|---|---|---|---|
| 5,265,258 A | | 11/1993 | Fiene et al. .................. 711/158 |
| 5,394,353 A | * | 2/1995 | Nusinov et al. ............. 327/212 |
| 5,555,397 A | | 9/1996 | Sasama et al. ............... 711/158 |
| 5,619,446 A | | 4/1997 | Yoneda et al. ................ 365/49 |
| 6,069,573 A | * | 5/2000 | Clark et al. .................... 341/50 |
| 6,263,400 B1 | * | 7/2001 | Rangasayee et al. .......... 365/49 |
| 6,370,613 B1 | * | 4/2002 | Diede et al. ................. 711/100 |
| 6,374,325 B1 | * | 4/2002 | Simpson et al. ............. 711/108 |

* cited by examiner

Primary Examiner—Than Nguyen
(74) Attorney, Agent, or Firm—Bever, Hoffman & Harms

(57) ABSTRACT

A method of generating a priority address using a priority encoder that includes the steps of: (1) providing a plurality of match signals from a CAM cell memory array to the priority encoder, (2) generating a most significant address bit of the priority address in response to a first set of the match signals, and (3) generating a least significant address bit of the priority address in response to the most significant address bit and a second set of the match signals. In one embodiment, step (3) is implemented by splitting the determination of the least significant address bit into two separate determinations, and the using the most significant address bit to select the result of one of these two separate determinations. Using the most significant address bit to help determine the least significant address bit significantly increases the speed of determining the least significant address bit, thereby increasing the overall speed of the priority encoder. Another embodiment includes a priority encoder that includes a first address generator for generating the most significant address bit in response to the first set of match signals, and a second address generator for generating the least significant address bit in response to the second set of match signals and the most significant address bit.

15 Claims, 11 Drawing Sheets

| Match Signal | Address Signal $A_2$ | Address Signal $A_1$ | Address Signal $A_0$ |
|---|---|---|---|
| $MATCH_0$ | 0 | 0 | 0 |
| $MATCH_1$ | 0 | 0 | 1 |
| $MATCH_2$ | 0 | 1 | 0 |
| $MATCH_3$ | 0 | 1 | 1 |
| $MATCH_4$ | 1 | 0 | 0 |
| $MATCH_5$ | 1 | 0 | 1 |
| $MATCH_6$ | 1 | 1 | 0 |
| $MATCH_7$ | 1 | 1 | 1 |

Fig. 2
(PRIOR ART)

INCREASING PRIORITY ENCODER SPEED USING THE MOST SIGNIFICANT BIT OF A PRIORITY ADDRESS

FIELD OF THE INVENTION

The present invention relates to a priority encoder. More specifically, the present invention relates to a priority encoder having increased processing speed for the least significant address bits.

DISCUSSION OF RELATED ART

CAM cells are defined as memory cells that are addressed in response to their content, rather than by a physical address within an array. Rows of CAM cells within an array assert or de-assert associated match signals indicating whether or not each CAM cell row matches the data values applied to the CAM cell array. These match signals are provided to a priority encoder that in turn provides the address of the row of matching CAM cells having the highest priority.

FIG. 1 is a block diagram of a conventional 8n-row by 5-column CAM cell memory array 100 and a 3-bit priority encoder 101. The CAM cells are labeled $M_{X, Y}$, where X is the row of the array, and Y is the column of the array. Thus, the array includes CAM cells $M_{0, 0}$ to $M_{7, 4}$. The required number of address signals provided by priority encoder 101 is defined as the base 2 logarithm of the number of rows in CAM cell memory array 100, rounded up.

Each of the CAM cells in array 100 is programmed to store a data value. In the described example, the data value stored in each CAM cell is indicated by either a "0" or a "1" in brackets. For example, CAM cells $M_{0, 0}$, $M_{0, 1}$, $M_{0, 2}$, $M_{0, 3}$, and $M_{0, 4}$ store data values of 1, 1, 1, 1, and 1, respectively. Each row of CAM cells is coupled to a common match line to provide a match signal for the row. For example, CAM cells $M_{0, 0}$, $M_{0, 1}$, $M_{0, 2}$, $M_{0, 3}$, and $M_{0, 4}$ are coupled to the common match line that provides the $MATCH_0$ signal.

The array of CAM cells is addressed by providing a data value to each column of CAM cells. Thus, data values $D_0$, $D_1$, $D_2$, $D_3$, and $D_4$ are provided to columns 0, 1, 2, 3, and 4, respectively. Note that complimentary data values $D_0\#$, $D_1\#$, $D_2\#$, $D_3\#$, and $D_4\#$ are also provided to columns 0, 1, 2, 3, and 4, respectively. If the data values stored in a row of the CAM cells match the applied data values $D_0$, $D_1$, $D_2$, $D_3$, and $D_4$, then a match condition occurs. For example, if the data values $D_0$, $D_1$, $D_2$, $D_3$, and $D_4$ are 0, 1, 0, 0, and 0, respectively, then the data values stored in the CAM cells of row 1 match the applied data values. Under these conditions, the $MATCH_1$ signal is high. The high state of the $MATCH_1$ signal is shown by the value "1" in brackets. Because the applied data values $D_0$, $D_1$, $D_2$, $D_3$, and $D_4$ also match the data values stored in the CAM cells of rows 3 and 7, the $MATCH_3$ and $MATCH_7$ signals also are high. Because the applied data values $D_0$, $D_1$, $D_2$, $D_3$, and $D_4$ do not match the data values stored in the CAM cells of rows 0, 2, or 4–6, the $MATCH_0$, $MATCH_2$, and $MATCH_4$–$MATCH_6$ signals are pulled low.

Priority encoder 101 receives the $MATCH_0$–$MATCH_7$ signals. Priority encoder 101 is a 3-bit priority encoder because three address signals are required to identify the $MATCH_0$–$MATCH_7$ signals. Each of the $MATCH_0$–$MATCH_7$ signals is received at an address, which is noted beside each match signal. For example, the $MATCH_1$ signal is received at address "001". Priority encoder 101 provides the address of the asserted match signal with the highest priority (lowest address) as the priority address $A_2$–$A_0$. Of the asserted match signals $MATCH_1$, $MATCH_3$, and $MATCH_7$, the $MATCH_1$ signal has the highest priority. Therefore, the address of the $MATCH_1$ signal (i.e., "001") is provided as the priority address $A_2$–$A_0$. Thus, the logic value of priority address bit $A_2$ is "0", of priority address bit $A_1$ is "0", and of priority address bit $A_0$ is "1". Priority encoder 101 asserts the HIT# signal low when at least one of the match signals has a logic high value. This logic low value of the HIT# signal is denoted by a "0" in brackets. A logic low value of the HIT# signal means that the priority address $A_2$–$A_0$ is valid.

Conventionally, the bits of the priority address $A_2$–$A_0$ are generated in parallel in response to the $MATCH_0$–$MATCH_7$ signals. Thus, each of the priority address bits $A_2$–$A_0$ is independently generated. As a result, the time taken to provide a valid address from the priority encoder is equal to the maximum time taken to calculate any one of the priority address bits $A_2$–$A_0$.

FIG. 2 is a truth table for 3-bit priority encoder 101 of FIG. 1. Each row is labeled with one of the $MATCH_0$–$MATCH_7$ signals and each column is labeled with one of the priority address bits $A_2$–$A_0$. The table of FIG. 2 shows the priority address associated with each match line. Thus, the priority address of the $MATCH_3$ signal is "100", with the priority address bit $A_2$ equal to "0", the priority address bit $A_1$ equal to "1", and the priority address bit $A_0$ equal to "1". The match signal with the highest priority in this scheme is the match signal with the lowest priority address. Thus, if all of the $MATCH_0$–$MATCH_7$ signals are asserted high, the $MATCH_0$ signal (i.e., the signal at address "000") has priority over the $MATCH_1$–$MATCH_7$ signals (i.e., the signals at addresses "001"–"111"). In the above example, the $MATCH_1$ signal has the highest priority of the asserted $MATCH_1$, $MATCH_3$, and $MATCH_7$ signals.

FIG. 3 is a schematic diagram of a conventional $A_0$ generator 300. $A_0$ generator 300 includes inverters 301–306, n-channel transistors 307–316 and p-channel transistor 317. $A_0$ generator 300 is used to generate the least significant bit (LSB) (i.e., the $A_0$ signal) of the priority address. $A_0$ generator 300 typically exhibits the largest delay in the generation of priority address bits $A_2$–$A_0$. Each pass transistor 311–316 contributes a resistance (i.e., delay) to the determination of the least significant priority address bit $A_0$. Thus, if the only matching signal is the lowest priority match signal (i.e., the $MATCH_7$ signal), then the total (and worst case) delay in determining the least significant priority address bit $A_0$ is the sum of the delays caused by pass transistors 311–316. If each pass transistor has the same resistance, the total delay for $A_0$ generator 300 is equal to 6 times the delay attributable to one pass transistor, or 6 pass transistor delays.

FIG. 4 is a schematic diagram of another conventional $A_0$ generator 400. $A_0$ generator 400 includes inverters 401–407 and n-channel transistors 408–421. $A_0$ generator 400 also is used to generate the least significant priority address bit $A_0$. Each of pass transistors 415–420 contributes resistance during the determination of priority address bit $A_0$ that results in the worst case delay. If each of pass transistors 415–420 has the same resistance, the worst case delay for $A_0$ generator 400 is equal to 6 times the delay attributable to one pass transistor, or 6 pass transistor delays.

It would therefore be desirable to have a priority encoder that generates the least significant priority address bit $A_0$ more quickly than $A_0$ generators 300 and 400.

SUMMARY

Accordingly, the present invention provides an improved method of generating a priority address that includes the steps of: (1) providing a plurality of match signals from a CAM cell array to a priority encoder, (2) generating a most significant address bit of the priority address in response to a first set of the match signals, and (3) generating a least significant address bit of the priority address in response to the most significant address bit and a second set of the match signals.

In one embodiment, the step of generating the least significant address bit is implemented by splitting the determination of the least significant address bit into two separate determinations, and the using the most significant address bit to select the result of one of these two separate determinations.

Using the most significant address bit to help determine the least significant address bit significantly increases the speed of determining the least significant address bit, thereby increasing the overall speed of the priority encoder.

Another embodiment of the present invention includes a priority encoder that generates a priority address in response to a plurality of match signals provided by a CAM cell array. The priority encoder includes a first address generator for generating a most significant priority address bit in response to a first set of match signals, and a second address generator for generating a least significant priority address bit in response to the second set of match signals and the most significant priority address bit.

In one embodiment, the first set of match signals includes the half of the match signals that have the highest priority. The determination of the most significant address bit in response to the first set of match signals is a relatively fast operation, having an insignificant delay. The most significant address bit is provided to the second address generator to control the generation of the least significant address bit.

In one embodiment, the second address generator includes a first circuit, a second circuit, and a selector circuit. The first circuit is configured to generate a first address signal in response to a first subset of the second set of match signals. The second circuit is configured to generate a second address signal in response to a second subset of the second set of match signals. The first circuit performs one half of the determination of the least significant address bit, and the second circuit performs the other half of the determination of the least significant address bit, with the first circuit and the second circuit operating in parallel. The selector circuit routes either the first address signal or the second address signal as the least significant address bit in response to the most significant address bit. Splitting the determination of the least significant address bit into two parallel determinations advantageously minimizes the delay in generating the least significant address bit. As a result, the overall speed of the priority encoder is increased.

The present invention will be more fully understood in view of the following description and drawings.

BRIEF DESCRIPTION OF THE DRAWINGS

FIG. 2 is a truth table for a 3-bit priority encoder;

DETAILED DESCRIPTION

Figure 1:
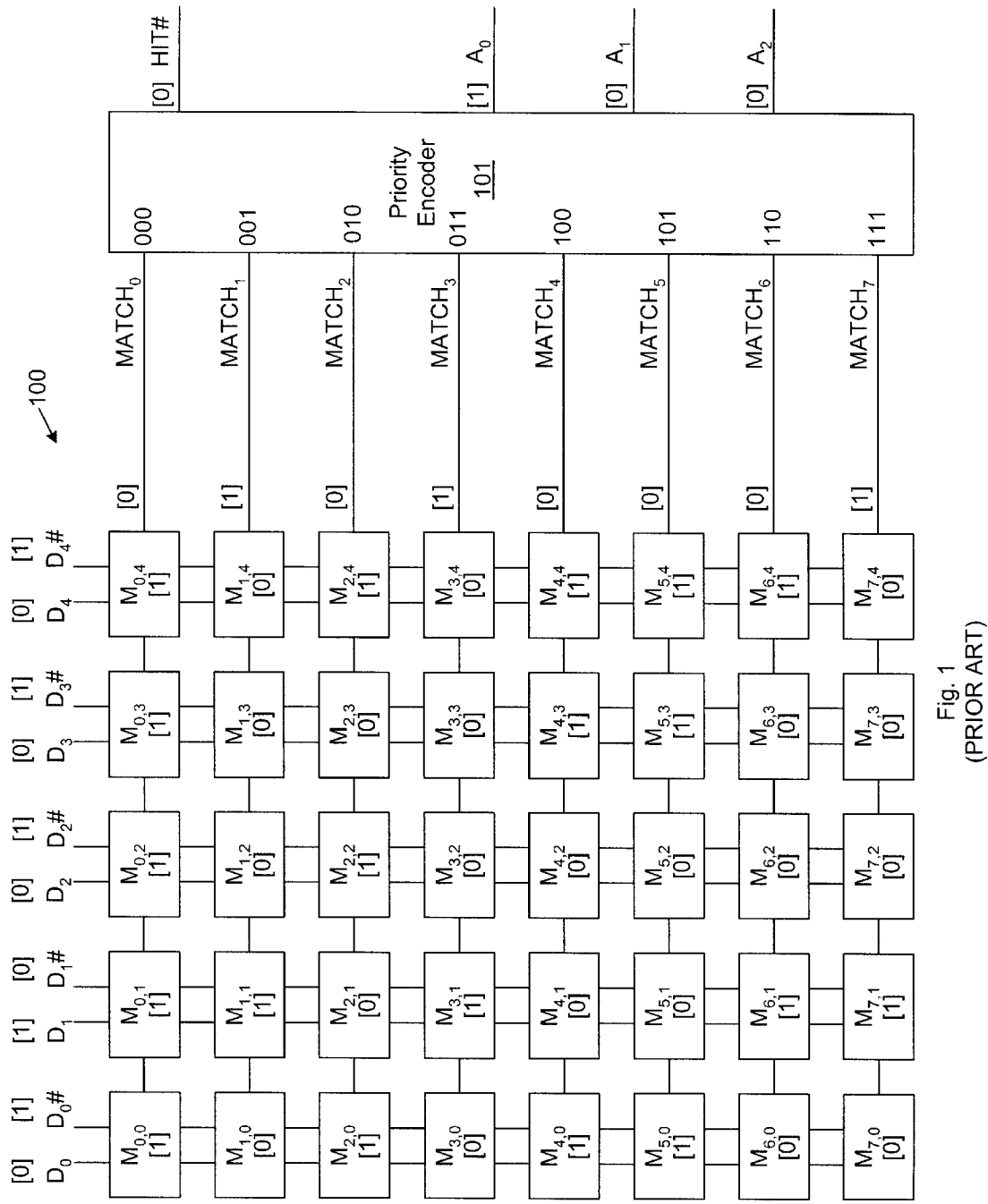
FIG. 1 is a block diagram of a conventional memory array formed using forty CAM cells and a 3-bit priority encoder.
Figure 5:
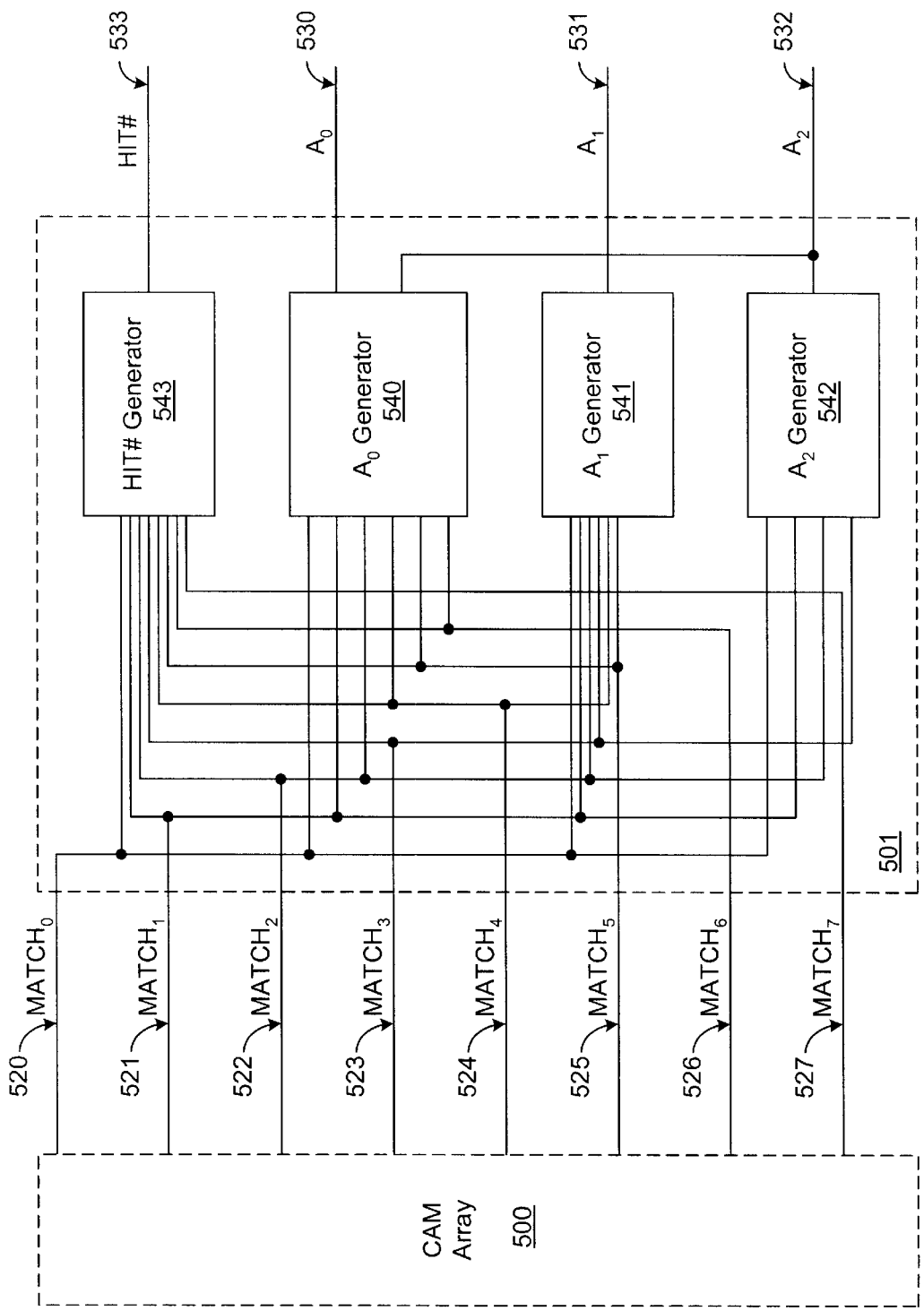
FIG. 5 is a block diagram of a 3-bit priority encoder in accordance with one embodiment of the present invention.

FIG. 5 is a block diagram of a conventional 8-row CAM cell memory array 500 and a 3-bit priority encoder 501 in accordance with an embodiment of the present invention. Priority encoder 501 includes address generators 540–542 and HIT# generator 543. Priority encoder 501 is coupled to receive eight $MATCH_0$–$MATCH_7$ signals from 8-row CAM array 500 on match lines 520–527, respectively. HIT# generator 543 provides a HIT# signal on hit line 533 in response to the $MATCH_0$–$MATCH_7$ signals. $A_2$ address generator 542 provides the most significant priority address bit $A_2$ on address line 532 in response to the $MATCH_0$–$MATCH_3$ signals. $A_1$ address generator 541 provides intermediate significance priority address bit $A_1$ on address line 531 in response to the $MATCH_0$–$MATCH_5$ signals. $A_0$ address generator 540 provides the least significant priority address bit $A_0$ on address line 530 in response to the $MATCH_0$–$MATCH_2$ and $MATCH_4$–$MATCH_6$ signals. In the present embodiment, conventional CAM array 500 is identical to CAM array 100 (FIG. 1). Although the present embodiment describes a 3-bit priority encoder that operates in response to eight match signals, it is understood that priority encoders of other sizes can be implemented using the teachings of the present disclosure.

Priority encoder 501 operates as follows. Prior to a compare operation within the CAM array 500, each of the $MATCH_0$–$MATCH_7$ signals is held to a logic low value. Comparison data values $D_0$–$D_4$ (and complimentary data values $D_0\#$–$D_4\#$) are then applied to CAM array 500. For each row of CAM cells that matches the comparison data values, a logic high match signal is asserted on a corresponding one of the match lines 520–527. Generators 540–543 generate a priority address $A_0$–$A_2$ and a HIT# signal in response to these match signals. $A_0$ address generator 540 is coupled to receive the most significant priority address bit $A_2$ from $A_2$ address generator 542. As described in more detail below, using the most significant priority address bit $A_2$ to generate the least significant priority address bit $A_0$ advantageously speeds up the determination of the least significant priority address bit $A_0$. Because the speed of determining the least significant priority address bit $A_0$ is the limiting factor in determining priority address $A_0$–$A_2$, the overall speed of determining priority address $A_0$–$A_2$ is advantageously increased. Generators 540–543 are described in more detail in connection with FIGS. 6–11.

Figure 6:
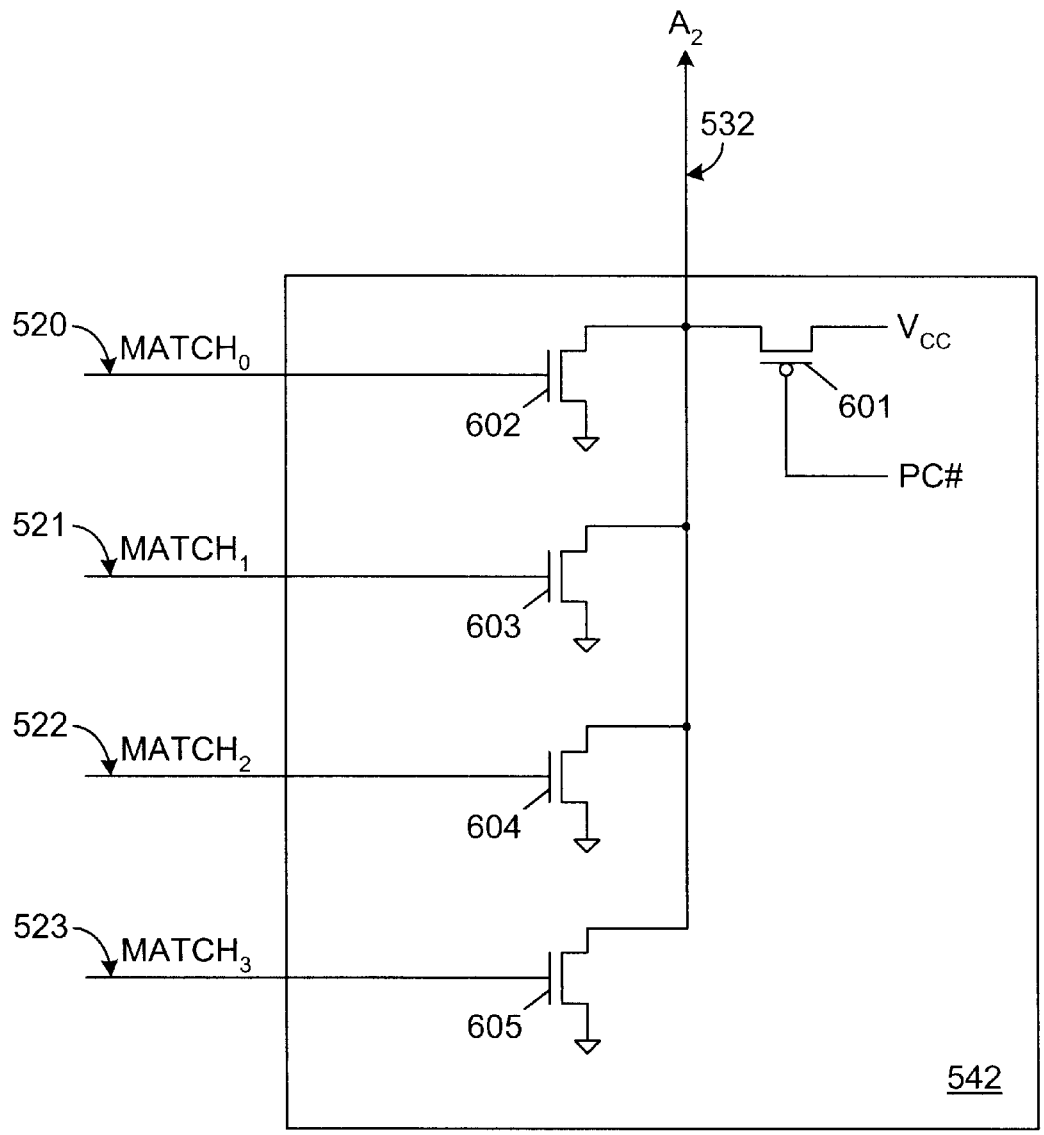
FIG. 6 is a schematic diagram of an address signal generator in accordance with one embodiment of the present invention.

FIG. 6 is a schematic diagram of $A_2$ address generator 542 in accordance with one embodiment of the present invention. $A_2$ address generator 542 includes p-channel transistor 601 and n-channel transistors 602–605. Each of n-channel transistors 602–605 has a source coupled to address line 532 and a drain coupled to ground. The gates of n-channel transistors 602–605 are coupled to receive the $MATCH_0$–$MATCH_3$ signals on match lines 520–523, respectively. P-channel transistor 601 has a source coupled to the $V_{CC}$ voltage supply source terminal and a drain coupled to address line 532. The gate of p-channel transistor 601 is coupled to receive a pre-charge control signal (PC#).

Figure 3:
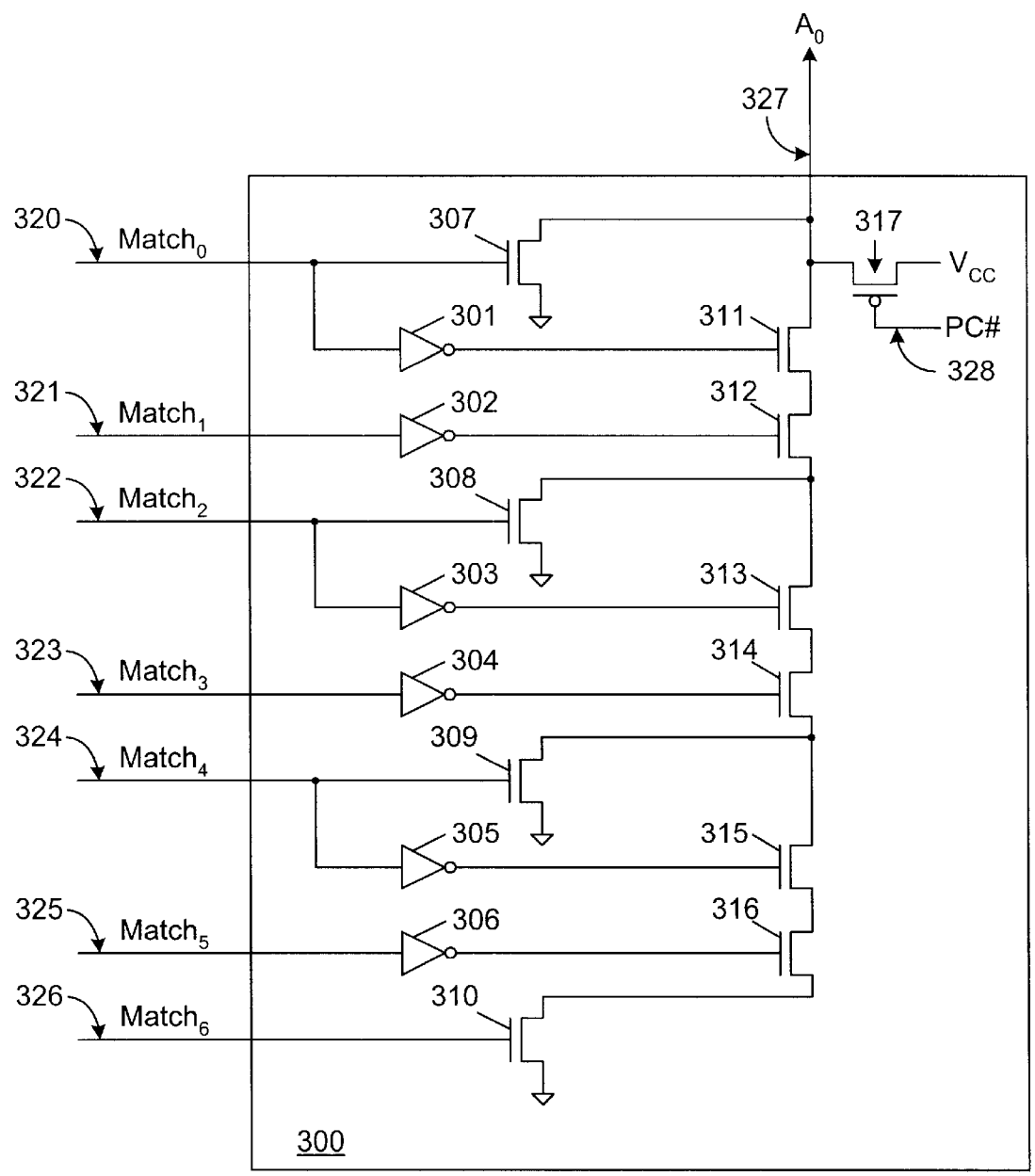
FIG. 3 is a schematic diagram of a conventional LSB generator.

$A_2$ address generator 542 operates as follows. Address line 532 is initially pre-charged to a logic high value by asserting the PC# signal low while the $MATCH_0$–$MATCH_3$ signals are low. Under these conditions, address line 532 is coupled to receive the $V_{CC}$ supply voltage through p-channel transistor 601. The PC# signal is then de-asserted high, thereby isolating address line 532 from the $V_{CC}$ voltage supply source. The inherent capacitance of address line 532 enables this line to maintain the charge applied while the PC# signal was low. Thus, the priority address bit $A_2$ has an initial logic high value. After the pre-charge operation, if any of the $MATCH_0$–$MATCH_3$ signals transition to a logic high value, the associated transistor for that match signal will turn on, thereby pulling down address line 532 to ground. This logic low level of address line 532 indicates a match condition on one or more of match lines 520–523. Note the correspondence to the truth table of FIG. 3. The most significant priority address bit $A_2$ has a logic low value if any of the $MATCH_0$–$MATCH_3$ signals is high, and a logic high value otherwise.

As implemented in FIG. 6, $A_2$ address generator 542 is a dynamic circuit. A dynamic circuit is a circuit in which only one change to the output signal is allowed. Address line 532 has an initial logic high value because of a pre-charge operation. If any of the $MATCH_0$–$MATCH_3$ signals transition to a logic high value, address line 532 will be pulled down to a logic low value. If all of the $MATCH_0$–$MATCH_3$ signals then return to logic low values, thereby turning off all of transistors 602–605, address line 532 remains at a logic low value because there is no way to re-charge address line 532 during a single operation. For this reason, the receipt of the $MATCH_0$–$MATCH_3$ signals must be carefully timed to ensure that the correct signals are received. The dynamic determination of the most significant priority address bit $A_2$ is completed with the delay required to ensure that the match signals are timed properly plus the time required to pull down address line 532 through any one of transistors 602–605. Because this delay is relatively insignificant, $A_2$ address generation circuit 542 is referred to as a zero-delay circuit.

Figure 7:
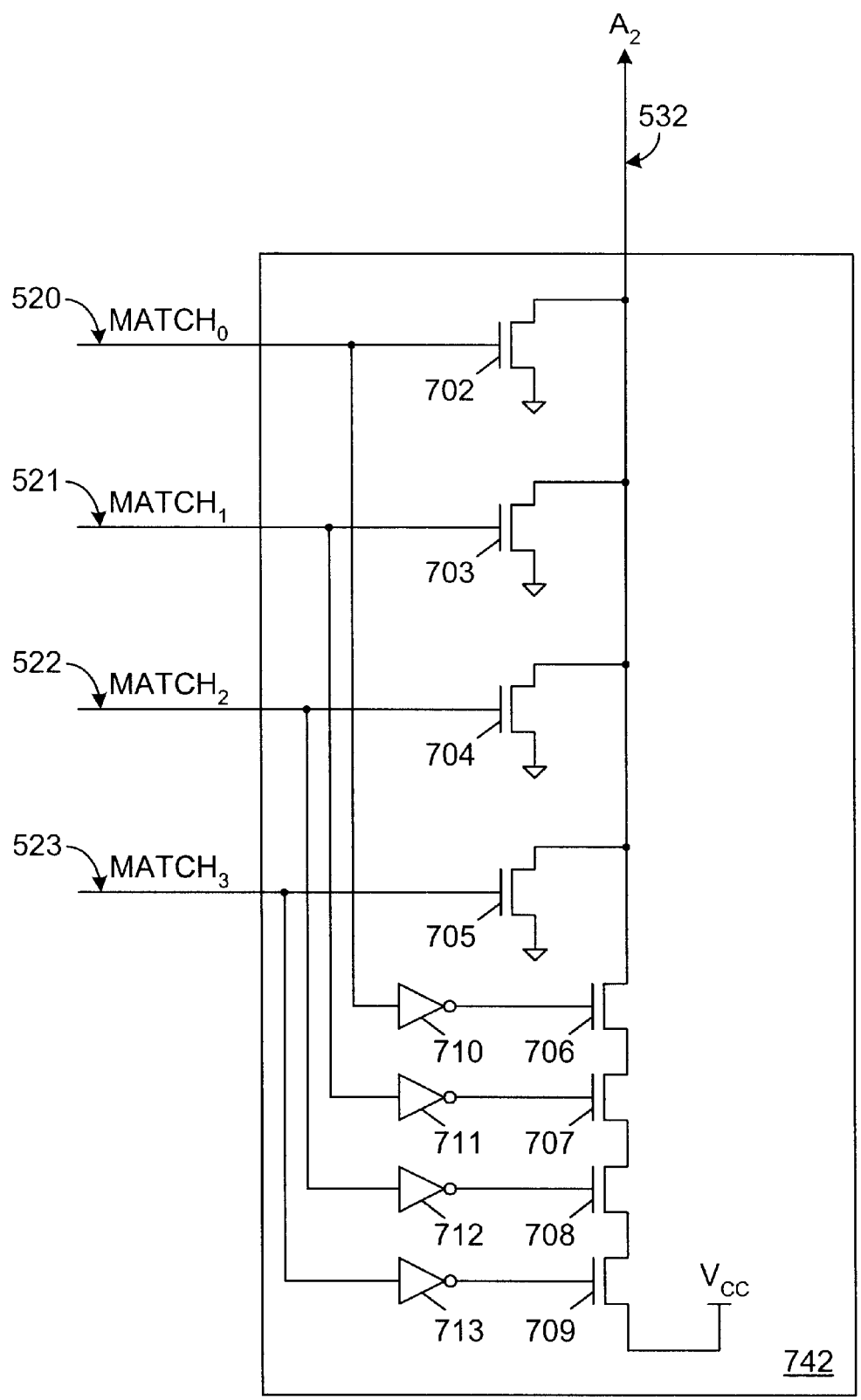
FIG. 7 is a schematic diagram of address signal generator in accordance with another embodiment of the present invention.

In another embodiment of the present invention, dynamic $A_2$ address generator 542 can be replaced with a static $A_2$ address generator. FIG. 7 is a schematic diagram of a static $A_2$ address generator 742 in accordance with another embodiment of the present invention. $A_2$ address generator 742 includes n-channel transistors 702–709 and inverters 710–713. Each of transistors 702–705 has a source coupled to address line 532 and a drain coupled to ground. The gates of transistors 702–705 are coupled to receive the $MATCH_0$–$MATCH_3$ signals on match lines 520–523, respectively. Pass transistors 706–709 are coupled in series between address line 532 and the $V_{CC}$ voltage supply source. Inverters 710–713 are coupled between match lines 520–523, respectively, and pass transistors 706–709, respectively.

$A_2$ address generator 742 operates as follows. The $MATCH_0$–$MATCH_3$ signals are initially held at logic low values. As a result, transistors 702–705 are turned off, and pass transistors 706–709 are turned on, thereby coupling address line 532 to the logic high value of the $V_{CC}$ voltage supply source. This logic high value indicates that none of the $MATCH_0$–$MATCH_3$ signals has a logic high value. If any of the $MATCH_0$–$MATCH_3$ signals transitions to a logic high value, address line 532 will be isolated from the $V_{CC}$ voltage supply source and pulled down to ground. For example, if the $MATCH_1$ signal is asserted high, then transistor 703 will turn on, thereby coupling address line 532 to ground. The logic high $MATCH_1$ signal will also cause pass transistor 707 to turn off, thereby isolating address line 532 from the $V_{CC}$ voltage supply source.

As implemented in FIG. 7, $A_2$ address generator 742 is a static circuit. A static circuit is a circuit in which multiple changes to the output signal are allowed. Thus, if any of the $MATCH_0$–$MATCH_3$ signals transition to a logic high value, address line 532 will be pulled down to a logic low value. If all of the $MATCH_0$–$MATCH_3$ signals subsequently return to logic low values, address line 532 is coupled to the $V_{CC}$ voltage supply source and is therefore pulled up to a logic high value. As a result, no pre-charge operation is required for $A_2$ address generator 742. The static determination of the most significant priority address bit $A_2$ is completed without any significant delay. That is, the delay in generating priority address bit $A_2$ is equal to the longer of the time required to isolate address line 532 by one of transistors 706–709 and the time required to pull down address line 532 through any one of transistors 702–705. Because this delay is relatively insignificant, $A_2$ address generation circuit 742 is referred to as a zero-delay circuit.

Figure 8:
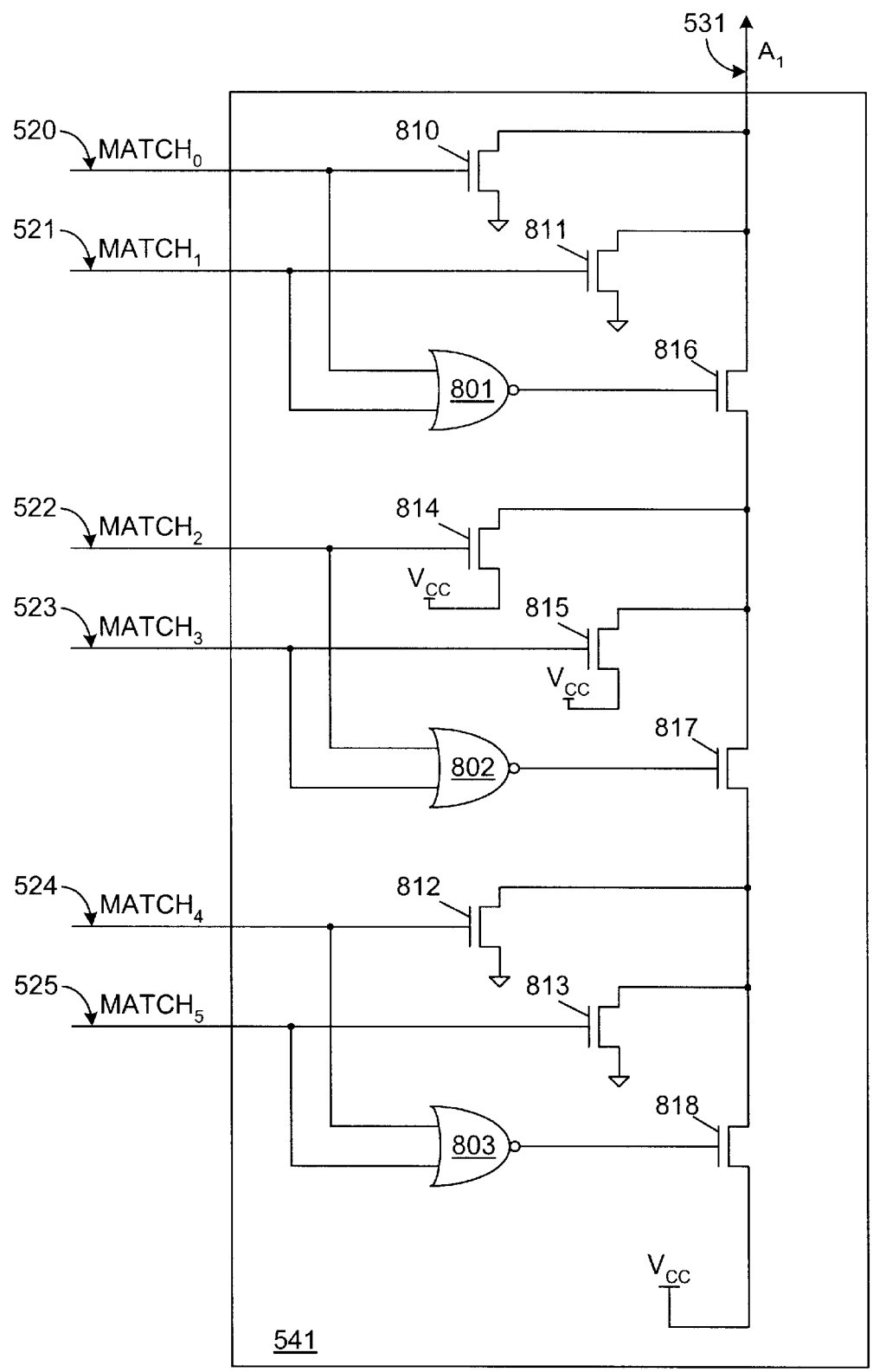
FIG. 8 is a schematic diagram of an address signal generator in accordance with one embodiment of the present invention.

FIG. 8 is a schematic diagram of $A_1$ address generator 541 in accordance with one embodiment of the present invention. $A_1$ address generator 541 includes NOR gates 801–803 and n-channel transistors 810–818.

Each of n-channel transistors 810–813 has a source coupled to address line 531 and a drain coupled to ground. The gates of n-channel transistors 810–813 are coupled to receive the $MATCH_0$–$MATCH_1$ and $MATCH_4$–$MATCH_5$ signals on match lines 520–521 and 524–525, respectively. Each of n-channel transistors 814–815 has a source coupled to address line 531 and a drain coupled to the $V_{CC}$ voltage supply source. The gates of n-channel transistors 814–815 are coupled to receive the $MATCH_2$–$MATCH_3$ signals on match lines 522–523, respectively. Pass transistor 816 is coupled in series along address line 531 between transistors 810–811 and transistors 814–815. Pass transistor 817 is coupled in series along address line 531 between transistors 814–815 and 812–813. Pass transistor 818 is coupled in series along address line 531 between transistors 812–813 and the $V_{CC}$ voltage supply source. NOR gate 801 has input terminals coupled to receive the $MATCH_0$ and $MATCH_1$ signals, and an output terminal coupled to the gate of transistor 816. NOR gate 802 has input terminals coupled to receive the $MATCH_2$ and $MATCH_3$ signals, and an output terminal coupled to the gate of transistor 817. NOR gate 803 has input terminals coupled to receive the $MATCH_4$ and $MATCH_5$ signals, and an output terminal coupled to the gate of transistor 818. As implemented in FIG. 8, $A_1$ address generator 541 is a static circuit.

$A_1$ address generator 541 operates as follows. The $MATCH_0$–$MATCH_5$ signals are initially held at logic low values. As a result, transistors 810–815 are turned off, and pass transistors 816–818 are turned on, thereby coupling address line 531 to the logic high value of the $V_{CC}$ voltage supply source. This logic high value indicates that none of the $MATCH_0$–$MATCH_1$ and $MATCH_4$–$MATCH_5$ signals has a logic high value. If any of the $MATCH_0$–$MATCH_1$ and $MATCH_4$–$MATCH_5$ signals transitions to a logic high value, address line 531 will be pulled down to ground. For example, if the MATCH$_1$ signal is asserted high, then transistor 811 will be turned on, thereby coupling address line 531 to ground. The logic high MATCH$_1$ signal will also cause NOR gate 801 to apply a logic low value to the gate of pass transistor 816, thereby turning off transistor 816 and isolating address line 531 from transistors 812–815, pass transistors 817–818, and the V$_{CC}$ voltage supply source. If any of the MATCH$_2$–MATCH$_3$ signals transitions to a logic high value, address line 531 will be pulled up to the V$_{CC}$ voltage supply source. For example, if the MATCH$_3$ signal is asserted high, then transistor 815 will be turned on, thereby coupling address line 531 to the V$_{CC}$ voltage supply source. The logic high MATCH$_3$ signal will also cause NOR gate 802 to provide a logic low value to the gate of pass transistor 819, thereby turning off this transistor 819 and isolating address line 531 from transistors 812–813 and pass transistor 818.

The longest delay in determining priority address bit A$_1$ exists when one or both of the MATCH$_4$ and MATCH$_5$ signals is asserted high. Under these conditions, address line 531 is pulled down to ground through pass transistors 816 and 817. Thus, there are two pass transistor delays associated with the generation of priority address bit A$_1$ in A$_1$ address generator 541.

Figure 9:
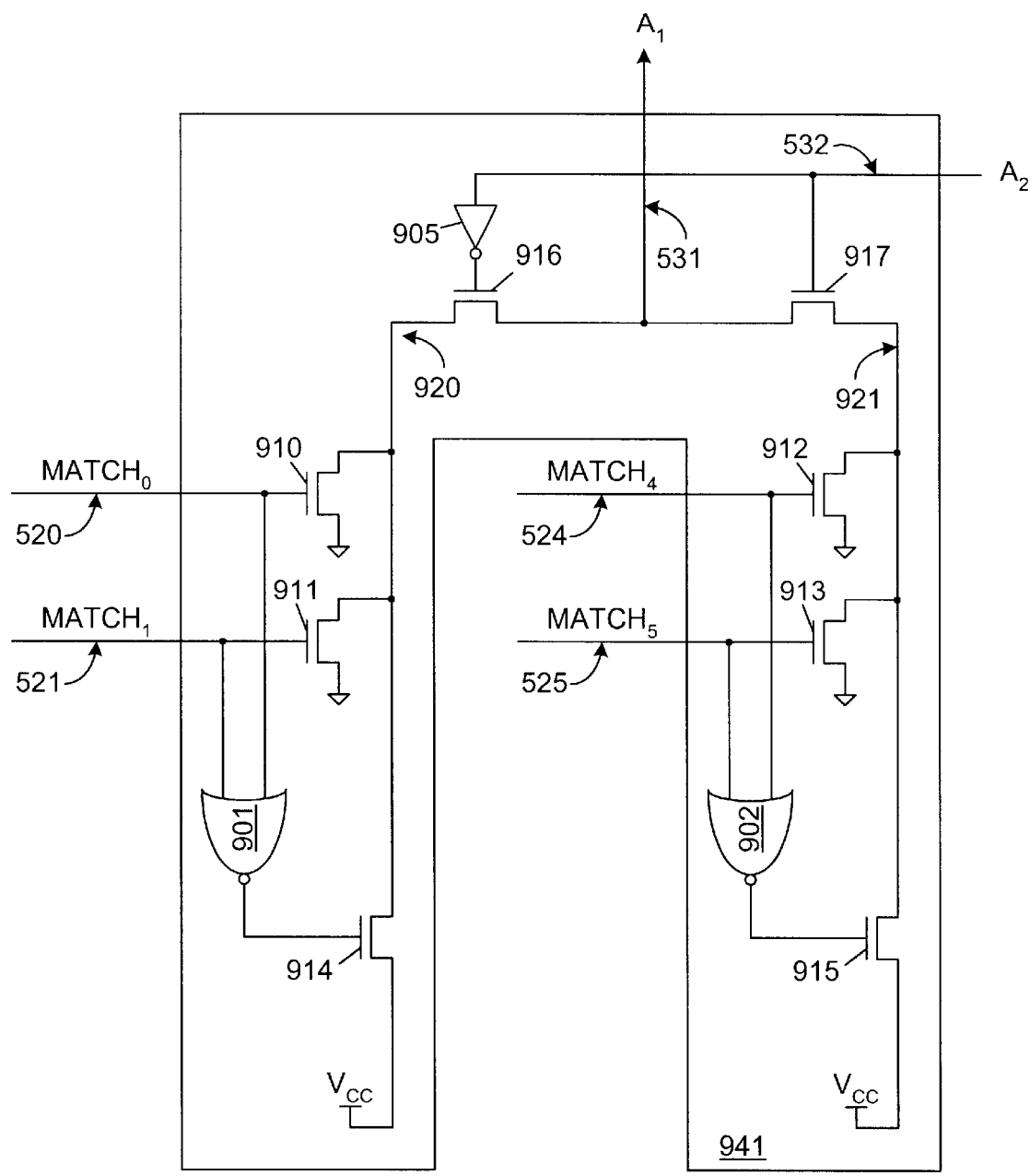
FIG. 9 is a schematic diagram of an address signal generator in accordance with another embodiment of the present invention.

In another embodiment of the present invention, dynamic A$_1$ address generator 541 can be replaced with an A$_1$ address generator with fewer delays. FIG. 9 is a schematic diagram of A$_1$ address generator 941 in accordance with such an embodiment of the present invention. A$_1$ address generator 941 includes NOR gates 901–902, inverter 905, n-channel transistors 910–917, and signal division lines 920–921.

Access transistors 916–917 are coupled in series between address line 531 and signal division lines 920–921, respectively. Inverter 905 is coupled between address line 532 and the control gate of access transistor 916. The control gate of access transistor 917 is coupled to address line 532. Each of n-channel transistors 910–911 has a source coupled to signal division line 920 and a drain coupled to ground. Each of n-channel transistors 912–913 has a source coupled to signal division line 921 and a drain coupled to ground. The gates of n-channel transistors 910–913 are coupled to receive the MATCH$_0$–MATCH$_1$ and MATCH$_4$–MATCH$_5$ signals on match lines 520–521 and 524–525, respectively. Pass transistor 914 is coupled in series between signal division line 920 and the V$_{CC}$ voltage supply source. Pass transistor 915 is coupled in series between signal division line 921 and the V$_{CC}$ voltage supply source. NOR gate 901 has input terminals coupled to receive the MATCH$_0$ and MATCH$_1$ signals, and an output terminal coupled to the gate of pass transistor 914. NOR gate 902 has input terminals coupled to receive the MATCH$_4$ and MATCH$_5$ signals, and an output terminal coupled to the gate of pass transistor 915. As implemented in FIG. 9, A$_1$ address generator 941 is a static circuit.

A$_1$ address generator 941 operates as follows. The MATCH$_0$–MATCH$_1$ and MATCH$_4$–MATCH$_5$ signals are initially held at logic low values. As a result, transistors 910–913 are turned off, and pass transistors 914–917 are turned on, thereby coupling signal division lines 920–921 to the V$_{CC}$ voltage supply source. If one or more of the MATCH$_0$–MATCH$_1$ signals transitions to a logic high value, signal division line 920 will be pulled down to ground. For example, if the MATCH$_1$ signal is asserted high, then transistor 911 will be turned on, thereby coupling signal division line 920 to ground. The logic high MATCH$_1$ signal will also cause NOR gate 901 to provide a logic low signal to the gate of pass transistor 914, thereby turning off pass transistor 914, and isolating signal division line 920 from the V$_{CC}$ voltage supply source. If one or more of the MATCH$_4$–MATCH$_5$ signals transitions to a logic high value, signal division line 921 will be pulled down to ground. For example, if the MATCH$_4$ signal is asserted high, then transistor 912 will be turned on, thereby coupling signal division line 921 to ground. The logic high MATCH$_4$ signal will also NOR gate 902 provide a logic low signal to the gate of pass transistor 915, thereby turning off pass transistor 915, and isolating signal division line 921 from the V$_{CC}$ voltage supply source.

The logic value of the most significant priority address bit A$_2$ (FIGS. 6–7) determines which one of signal division lines 920–921 is coupled to address line 531. As can be seen from the truth table of FIG. 2, if the most significant priority address bit A$_2$ has a logic low value, then priority address bit A$_1$ will have a logic low value if either one or more of the MATCH$_0$–MATCH$_1$ signals has a logic high value. If neither one of the MATCH$_0$–MATCH$_1$ signals has a logic high value, then one or more of the MATCH$_2$–MATCH$_3$ signals must necessarily have a logic high value (assuming that a hit exists). Under these conditions, the priority address bit A$_1$ must have a logic high value.

Consequently, if the most significant priority address bit A$_2$ has a logic low value, only match signals MATCH$_0$–MATCH$_1$ need to be tested to determine the value of priority address bit A$_1$.

Thus, if the most significant priority address bit A$_2$ has a logic low value, then pass transistor 916 is turned on, thereby coupling address line 531 to signal division line 920. The logic low address bit A$_2$ also turns off pass transistor 917, thereby isolating address line 531 from signal division line 921. Under these conditions, if one or more of the MATCH$_0$–MATCH$_1$ signals has a logic high value, then address line 531 is pulled down to ground through pass transistor 916 (and the turned on transistor(s) 910–911). If neither one of the MATCH$_0$–MATCH$_1$ signals has a logic high value, then address line 531 is pulled up to the V$_{CC}$ supply voltage through pass transistor 916 (and the turned on transistor 914). As a result, signal division line 920 provides the priority address bit A$_1$ in accordance with the truth table of FIG. 2 when the most significant priority address bit A$_2$ has a logic low value. The maximum delay for providing the priority address bit A$_1$ from signal division line 920 is the delay associated with one pass transistor (i.e., pass transistor 916).

Returning now to the truth table of FIG. 2, if the most significant priority address bit A$_2$ has a logic high value, then priority address bit A$_1$ will have a logic low value if either one or more of the MATCH$_4$–MATCH$_5$ signals has a logic high value. If neither one of the MATCH$_4$–MATCH$_5$ signals has a logic high value, then one or more of the MATCH$_6$–MATCH$_7$ signals must necessarily have a logic high value (assuming that a hit exists). Under these conditions, the priority address bit A$_1$ must have a logic high value. Consequently, if the most significant priority address bit A$_2$ has a logic high value, only match signals MATCH$_4$–MATCH$_5$ need to be tested to determine the value of priority address bit A$_1$.

Thus, if the most significant priority address bit A$_2$ has a logic high value, then pass transistor 917 is turned on, thereby coupling address line 531 to signal division line 921. The logic high address bit A$_2$ also turns off pass transistor 916, thereby isolating address line 531 from signal division line 920. Under these conditions, if one or more of the MATCH$_4$–MATCH$_5$ signals has a logic high value, then address line 531 is pulled down to ground through pass transistor 917 (and the turned on transistor(s) 912–913). If neither one of the MATCH$_4$–MATCH$_5$ signals has a logic high value, then address line 531 is pulled up to the V$_{CC}$ supply voltage through pass transistor 917 (and the turned on transistor 915). As a result, signal division line 921 provides the priority address bit A$_1$ in accordance with the truth table of FIG. 2 when the most significant priority address bit A$_2$ has a logic high value. The maximum delay for providing the priority address bit A$_1$ from signal division line 921 is the delay associated with one pass transistor (i.e., pass transistor 917).

As a result, the maximum delay of A$_1$ address generator 941 (i.e., one pass transistor delay) is less than the maximum delay associated with A$_1$ address generator 541 (i.e., two pass transistor delays). Note that using the most significant priority address bit A$_2$ to determine the lesser significance priority address bit A$_1$ advantageously decreases the A$_1$ determination delay from two pass transistor delays to one pass transistor delay.

Figure 10:
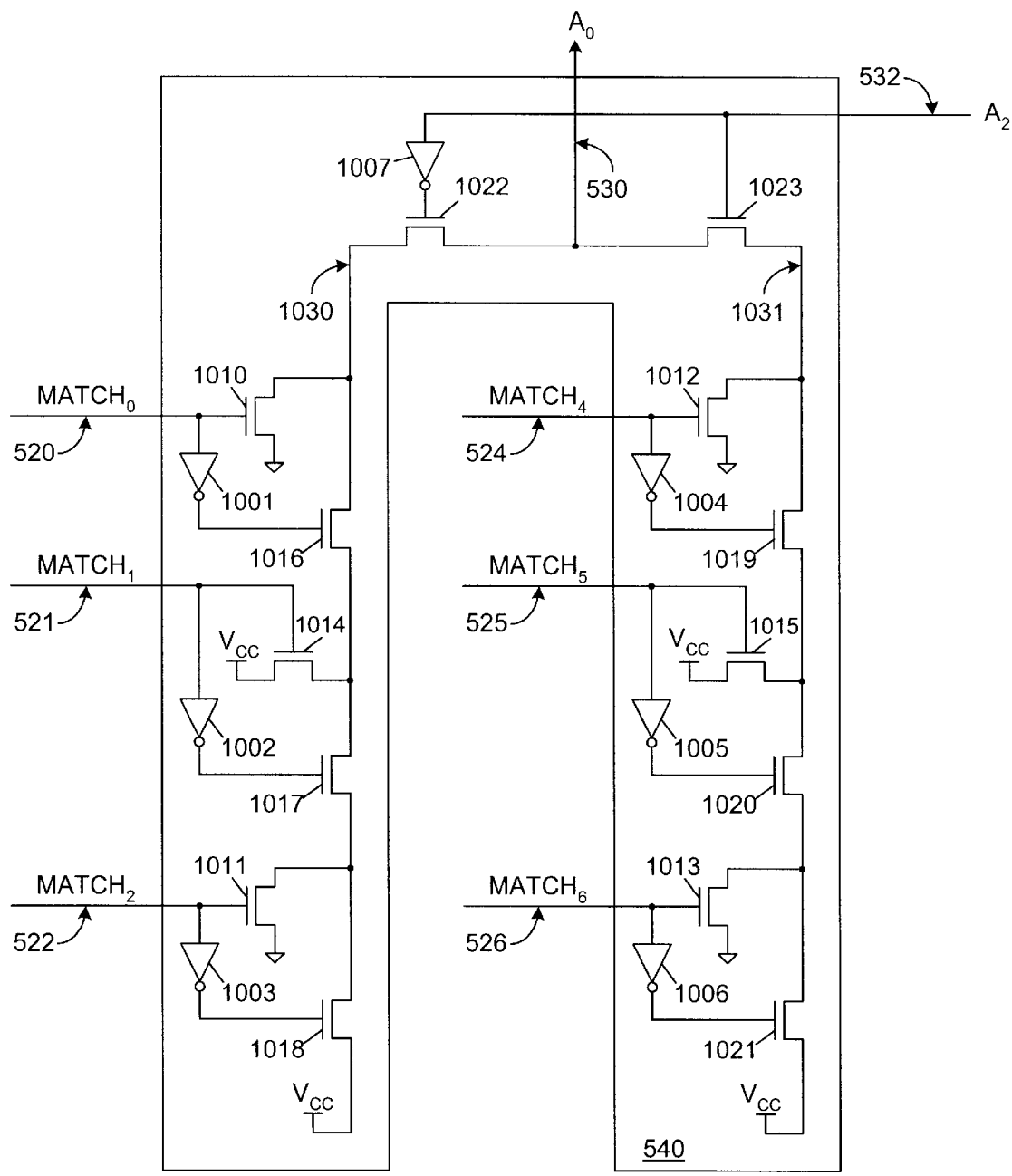
FIG. 10 is a schematic diagram of an address signal generator in accordance with one embodiment of the present invention.

FIG. 10 is a schematic diagram of A$_0$ address generator 540 in accordance with one embodiment of the present invention. A$_0$ address generator 540 includes inverters 1001–1007, n-channel transistors 1010–1023, and signal division lines 1030–1031. Like A$_1$ address generator 941, A$_0$ address generator 540 uses a pair of signal division lines that are coupled to an output address line in response to the most significant priority address bit A$_2$. As described in more detail below, this advantageously minimizes the delay time associated with providing the least significant priority address bit A$_0$.

Access transistors 1022–1023 are coupled between address line 530 and signal division lines 1030–1031, respectively. Inverter 1007 is coupled between address line 532 and the control gate of access transistor 1022. The control gate of access transistor 1023 is coupled to address line 532. Each of n-channel transistors 1010–1011 has a source coupled to signal division line 1030 and a drain coupled to ground. N-channel transistor 1014 has a source coupled to signal division line 1030 and a drain coupled to the V$_{CC}$ voltage supply source. Each of n-channel transistors 1012–1013 has a source coupled to signal division line 1031 and a drain coupled to ground. N-channel transistor 1015 has a source coupled to signal division line 1031 and a drain coupled to the V$_{CC}$ voltage supply source. The gates of n-channel transistors 1010–1013 are coupled to receive the MATCH$_0$, MATCH$_2$, MATCH$_4$, and MATCH$_6$ signals on match lines 520, 522, 524, and 526, respectively. The gates of n-channel transistors 1014–1015 are coupled to receive the MATCH$_1$ and MATCH$_5$ signals on match lines 521 and 525, respectively.

Pass transistor 1016 is coupled along signal division line 1030 between transistors 1010 and transistor 1014. Pass transistor 1017 is coupled along signal division line 1030 between transistors 1014 and transistor 1011. Pass transistor 1018 is coupled along signal division line 1030 between transistor 1011 and the V$_{CC}$ voltage supply source.

Pass transistor 1019 is coupled along signal division line 1031 between transistors 1012 and transistor 1015. Pass transistor 1020 is coupled along signal division line 1031 between transistors 1015 and transistor 1013. Pass transistor 1021 is coupled along signal division line 1031 between transistor 1013 and the V$_{CC}$ voltage supply source.

Inverters 1001–1006 are coupled between match lines 520–522 and 524–526, respectively, and the control gates of pass transistors 1016–1021, respectively. As implemented in FIG. 10, A$_1$ address generator 540 is a static circuit.

A$_0$ address generator 540 operates as follows. The MATCH$_0$–MATCH$_2$ and MATCH$_4$–MATCH$_6$ signals are initially held at logic low values. As a result, transistors 1010–1015 are turned off, and pass transistors 1016–1021 are turned on, thereby coupling signal division lines 1030–1031 to logic high values of the V$_{CC}$ voltage supply source. If any of the MATCH$_0$ and MATCH$_2$ signals transitions to a logic high value, signal division line 1030 will be pulled down to ground. For example, if the MATCH$_2$ signal is asserted high, then transistor 1011 will be turned on, thereby coupling signal division line 1030 to ground. The logic high MATCH$_2$ signal will also cause pass transistor 1018 to turn off, thereby isolating signal division line 1030 from the V$_{CC}$ voltage supply source.

If the MATCH$_1$ signal is asserted high, then transistor 1014 will be turned on, thereby coupling signal division line 1030 to the V$_{CC}$ voltage supply source. The logic high MATCH$_1$ signal will also cause pass transistor 1017 to turn off, thereby isolating signal division line 1030 from transistor 1011 and pass transistor 1018.

Similarly, if any of the MATCH$_4$ and MATCH$_6$ signals transitions to a logic high value, signal division line 1031 will be pulled down to ground. Additionally, if the MATCH$_5$ signal transitions to a logic high value, signal division line 1031 will be pulled up to the V$_{CC}$ voltage supply source.

The logic value of the most significant priority address bit A$_2$ determines which one of signal division lines 1030–1031 is coupled to address line 530. As can be seen from the truth table of FIG. 2, if the most significant priority address bit A$_2$ has a logic low value, then the least significant priority address bit A$_0$ will depend on the status of the MATCH$_0$–MATCH$_3$ signals. Conversely, if the most significant priority address bit A$_2$ has a logic high value, then the least significant priority address bit A$_0$ will depend on the status of the MATCH$_4$–MATCH$_7$ signals.

In A$_0$ address generator 540, if the most significant priority address bit A$_2$ has a logic low value, then pass transistor 1022 is turned on, thereby coupling address line 530 to signal division line 1030. The logic low address bit A$_2$ also turns off pass transistor 1023, thereby isolating address line 530 from signal division line 1031. Under these conditions, if the MATCH$_0$ signal has a logic high value, then address line 530 is pulled down to ground through pass transistor 1022 and turned on transistor 1010. The logic high MATCH$_0$ signal also turns off transistor 1016, thereby isolating signal division line 1030 from the circuitry located below transistor 1016.

If both address bit A$_2$ and the MATCH$_0$ signal have logic low values, and the MATCH$_1$ signal has a logic high value, then address line 530 is pulled up to the V$_{CC}$ supply voltage through pass transistors 1022 and 1016 and turned on transistor 1014. The logic high MATCH$_1$ signal also turns off transistor 1017, thereby isolating signal division line 1030 from the circuitry located below transistor 1017.

If address bit A$_2$ and the MATCH$_0$–MATCH$_1$ signals have logic low values, and the MATCH$_2$ signal has a logic high value, then address line 530 is pulled down to ground through pass transistors 1022, 1016 and 1017 and turned on transistor 1011. The logic high MATCH$_2$ signal also turns off transistor 1018, thereby isolating signal division line 1030 from the V$_{CC}$ voltage supply source.

If address bit A$_2$ and the MATCH$_0$–MATCH$_2$ signals all have logic low values, then address line 530 remains in its initial state (i.e., pulled up to the V$_{CC}$ supply voltage through pass transistors 1022 and 1016–1018).

In the foregoing manner, signal division line 1030 provides the least significant priority address bit A$_0$ in accordance with the truth table of FIG. 2 when the most significant priority address bit $A_2$ has a logic low value. The maximum delay for providing the priority address bit $A_0$ from signal division line 1030 is the delay associated with three pass transistors (i.e., pass transistors 1016, 1017 and 1022).

If the most significant priority address bit $A_2$ has a logic high value, then pass transistor 1023 is turned on, thereby coupling address line 530 to signal division line 1031. The logic high address bit $A_2$ also turns off pass transistor 1022, thereby isolating address line 530 from signal division line 1030. Under these conditions, if the $MATCH_4$ signal has a logic high value, then address line 530 is pulled down to ground through pass transistor 1023 and turned on transistor 1012. The logic high $MATCH_4$ signal also turns off transistor 1019, thereby isolating signal division line 1031 from the circuitry located below transistor 1019.

If address bit $A_2$ has a logic high value, the $MATCH_4$ signal has a logic low value, and the $MATCH_5$ signal has a logic high value, then address line 530 is pulled up to the $V_{CC}$ supply voltage through pass transistors 1023 and 1019 and turned on transistor 1015. The logic high $MATCH_5$ signal also turns off transistor 1020, thereby isolating signal division line 1031 from the circuitry located below transistor 1020.

If address bit $A_2$ has a logic high value, the $MATCH_4$–$MATCH_5$ signals have logic low values, and the $MATCH_6$ signal has a logic high value, then address line 530 is pulled down to ground through pass transistors 1023, 1019 and 1020 and turned on transistor 1013. The logic high $MATCH_6$ signal also turns off transistor 1021, thereby isolating signal division line 1031 from the $V_{CC}$ voltage supply source.

If address bit $A_2$ has a logic low value and the $MATCH_4$–$MATCH_6$ signals all have logic low values, then address line 530 remains in its initial state (i.e., pulled up to the $V_{CC}$ supply voltage through pass transistors 1023 and 1019–1021).

In the foregoing manner, signal division line 1031 provides the least significant priority address bit $A_0$ in accordance with the truth table of FIG. 2 when the most significant priority address bit $A_2$ has a logic high value. The maximum delay for providing the priority address bit $A_0$ from signal division line 1031 is the delay associated with three pass transistors (i.e., pass transistors 1019, 1020 and 1023). The maximum delay for generating the least significant priority address bit $A_0$ using $A_0$ generator 540 is therefore three pass transistor delays. This represents a significant improvement over conventional $A_0$ generators 300 and 400, which have maximum delays of six pass transistor delays for generating the least significant priority address bit $A_0$.

Note that either one of $A_1$ generators 541 or 941 can be used with $A_0$ generator 540 without adversely affecting the overall speed of the resulting priority encoder. This is because both of $A_1$ generators 541 and 941 have maximum delays that are less than the maximum delay of $A_0$ generator 540.

Figure 11:
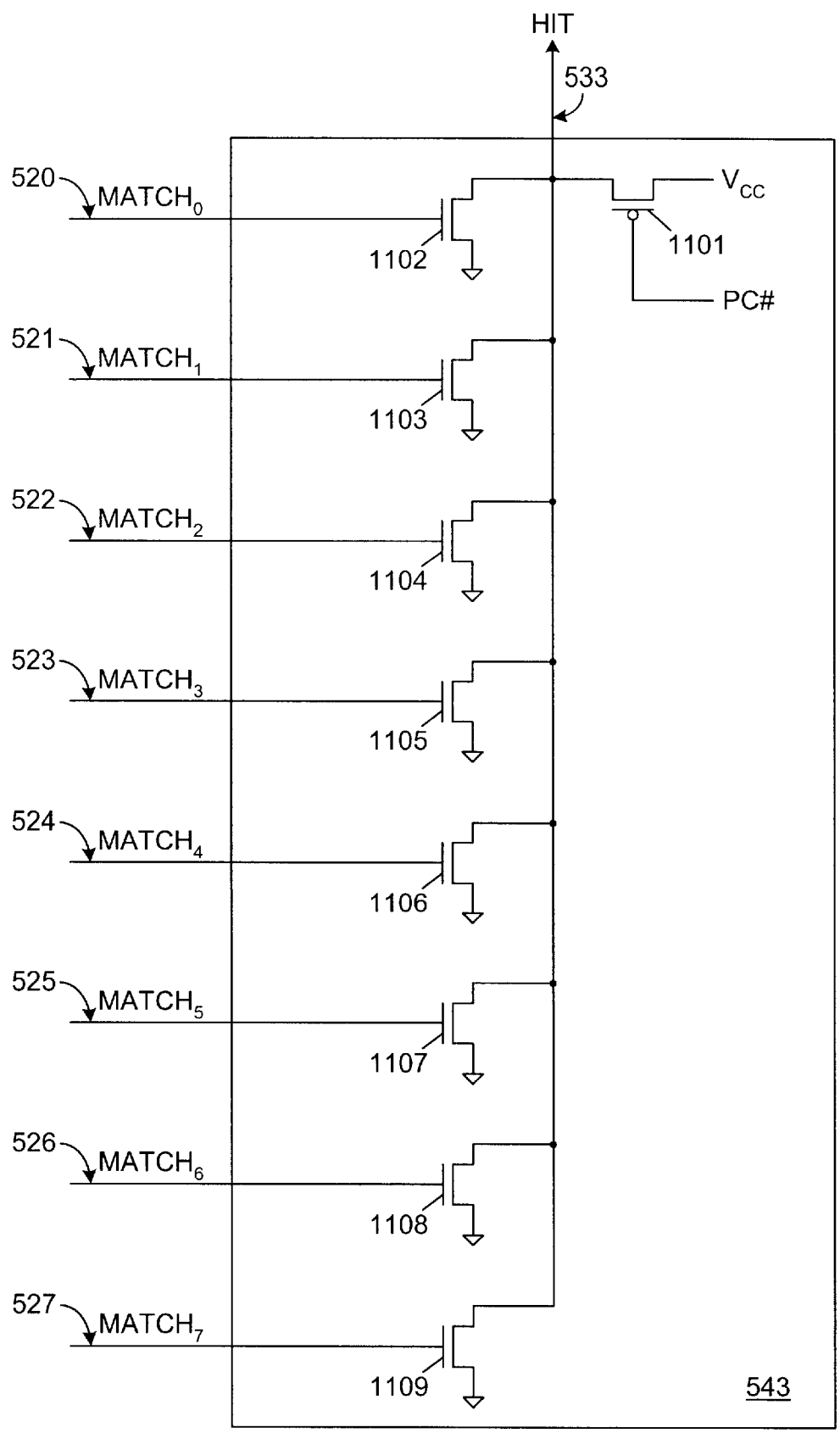
FIG. 11 is a schematic diagram of a HIT# signal generator in accordance with one embodiment of the present invention.

FIG. 11 is a schematic diagram of HIT# generator 543 in accordance with an embodiment of the present invention. HIT# generator 543 includes p-channel transistor 1101 and n-channel transistors 1102–1109.

HIT# generator 543 is a dynamic circuit and operates similarly to the dynamic $A_2$ address generator of FIG. 6. Thus, hit line 533 is pre-charged to a logic high value, thereby indicating that none of the $MATCH_0$–$MATCH_7$ signals has a logic high value. If one or more of the $MATCH_0$–$MATCH_7$ signals transitions to a logic high value, then the one or more of the corresponding transistors 1102–1109 will turn on, thereby pulling down hit line 533 to ground. This logic low level of hit line 533 indicates a match condition exists on one or more of match lines 520–527. This condition indicates that a valid priority address is provided on address lines 530–532. A logic high value on hit line 533 indicates that the priority address provided on address lines 530–532 is invalid. Like A2 generator 543, HIT# generator 543 is a zero-delay circuit. Consequently, HIT# generator 543 does not slow down the operation of priority encoder 501.

Figure 4:
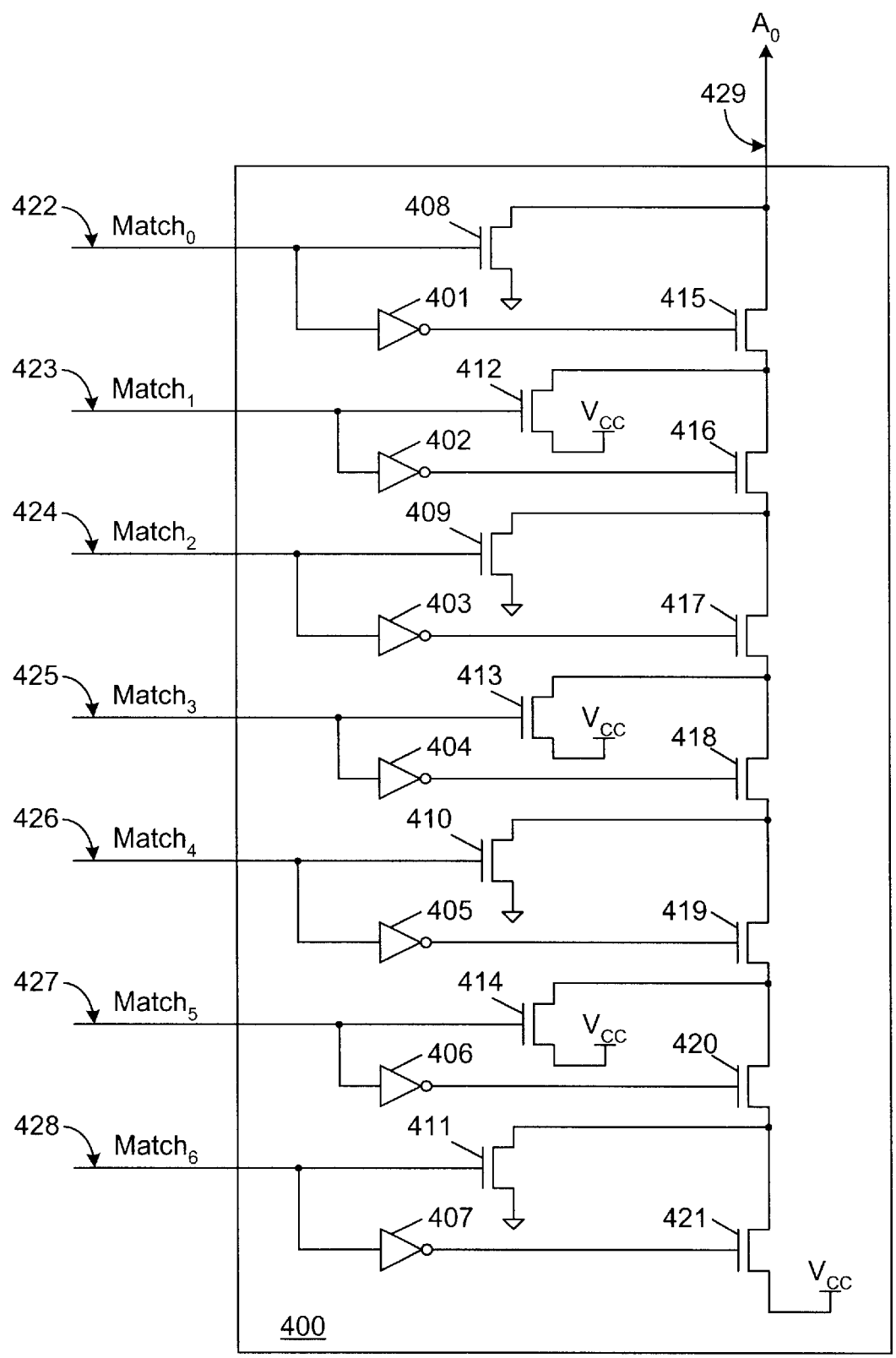
FIG. 4 is a schematic diagram of another conventional LSB generator.

As described above, the worst case delay for a priority encoder is typically equal to the worst case delay in the determination of the least significant priority address bit $A_0$. The present invention shortens the worst case delay by using the fastest determination (the MSB, $A_2$) to speed up the LSB determination. As described above, the worst case delay of the described embodiment of priority encoder 501 shortens the conventional 6 pass transistor delay (FIGS. 3–4) to a 3 pass transistor delay (FIG. 10).

Although the invention has been described in connection with a 3-bit embodiment, it is understood that this invention is not limited to the embodiment disclosed, but is capable of various modifications which would be apparent to a person skilled in the art. For example, the two most significant bits can be used to determine any number of the least significant bits in different embodiments. Thus, the invention is limited only by the following claims.

We claim:

1. A method of operating a priority encoder comprising the steps of:
   providing a plurality of match signals from a CAM cell memory array to a priority encoder;
   generating a most significant address bit of a priority address in response to a first set of the match signals; and
   generating a least significant address bit of the priority address in response to the most significant address bit.

2. The method of claim 1, wherein the first set of the match signals comprises a half of the match signals having a highest priority.

3. The method of claim 1, wherein the least significant address bit is further generated in response to a second set of the match signals.

4. The method of claim 3, wherein the step of generating the least significant address but further comprises the steps of:
   generating a first address signal in response to a first subset of the second set of match signals;
   generating a second address signal in response to a second subset of the second set of match signals; and
   selecting the least significant address bit from the first address signal and the second address signal using the most significant address bit.

5. The method of claim 4, wherein the first subset of the second set of match signals is a subset of the first set of match signals.

6. The method of claim 4, wherein the first subset of the second set of match signals has a higher priority than the second subset of the second set of match signals.

7. The method of claim 1 further comprising the step of generating an address bit of intermediate significance using the most significant address bit.

8. A priority encoder for generating a priority address in response to a plurality of match signals, the priority encoder comprising:

a first address generator for generating a most significant bit of the priority address in response to a first set of the match signals; and a second address generator for generating a least significant bit of the priority address in response to a second set of match signals and the most significant bit of the priority address.

9. The priority encoder of claim 8, wherein the second address generator further comprises:

a first circuit for generating a first address signal in response to a first subset of the second set of match signals;

a second circuit for generating a second address signal in response to a second subset of the second set of match signals; and a selector circuit for providing one of the first address signal and the second address signal as the least significant bit in response to the most significant bit.

10. The priority encoder of claim 9 wherein the selector circuit comprises:

an output terminal, wherein the least significant bit is provided on the output terminal;

a first transistor coupled between the first circuit and the output terminal, wherein the first transistor is controlled in response to the most significant bit; and a second transistor coupled between the second circuit and the output terminal, wherein the second transistor is controlled in response to the most significant bit.

11. The priority encoder of claim 10 wherein only one of the first transistor and second transistor is turned on at a given time by the most significant bit.

12. The priority encoder of claim 9, wherein the first subset of the second set of match signals is a subset of the first set of match signals.

13. The priority encoder of claim 9, wherein the first subset of the second set of match signals has a higher priority than the second subset of the second set of match signals.

14. The priority encoder of claim 8, further comprising a third address generator for generating an intermediate significance bit of the priority address in response to a third set of match signals and the most significant bit of the priority address.

15. The priority encoder of claim 8, wherein the first set of the match signals comprises a half of the match signals having a highest priority.

* * * * *